United States Patent
Lee et al.

(10) Patent No.: US 7,561,489 B2
(45) Date of Patent: Jul. 14, 2009

(54) SYSTEM AND METHOD OF SELECTIVE ROW ENERGIZATION BASED ON WRITE DATA

(75) Inventors: Michael J. Lee, Austin, TX (US); Jose A. Paredes, Austin, TX (US); Peter J. Klim, Austin, TX (US); Sam G. Chu, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/125,875

(22) Filed: May 22, 2008

(65) Prior Publication Data

US 2008/0219063 A1  Sep. 11, 2008

(51) Int. Cl.
*G11C 8/00* (2006.01)
(52) U.S. Cl. .............. 365/230.06; 365/189.05; 365/230.08
(58) Field of Classification Search ............ 365/230.06, 365/189.05, 230.08
See application file for complete search history.

(56) References Cited

U.S. PATENT DOCUMENTS

| 3,267,445 | A | 8/1966 | Ochsner et al. |
| 6,064,616 | A | 5/2000 | Ciraula et al. |
| 6,081,073 | A | 6/2000 | Salam |
| 6,108,255 | A | 8/2000 | Ciraula et al. |
| 6,341,097 | B1 * | 1/2002 | Hsu et al. .................. 365/222 |

* cited by examiner

*Primary Examiner*—Thong Q Le
(74) *Attorney, Agent, or Firm*—Casimer K. Salys; Jack V. Musgrove

(57) ABSTRACT

A system and method of selective row energization based on write data, with a selective row energization system including a storage array 102 having M rows 104 and N columns 106; an N-bit data word register 108; a uniform-detect circuit 110 responsive to a data word to generate a uniform word data bit having a first value when the data word is uniform; an M-bit uniform-detect register 112 having M uniform-detect latches 114, each being associated with one of the M rows 104 and storing the uniform word data bit for the data word stored in the associated M row 104; and an M-bit row driver device 116 responsive to the uniform word data bit for each of the M rows 104 to inhibit energization of the M rows 104 for which the uniform word data bit is the first value.

15 Claims, 6 Drawing Sheets

SYSTEM AND METHOD OF SELECTIVE ROW ENERGIZATION BASED ON WRITE DATA

TECHNICAL FIELD

The technical field of this disclosure is computer systems, particularly, selective row energization of an array based on data to be written to the array.

BACKGROUND OF THE INVENTION

Storage arrays typically require a number of operations to read from or write to the array. One example of a storage array employs static random access memory (SRAM), which uses a group of transistors to store data. The SRAM array includes bitlines connected from column drivers to the array columns and wordlines connected from row drivers to the array rows. Each bitline can include a number of individual lines, such as true and complement lines, as required for the particular transistor configuration. In operation, the SRAM array alternates between a precharge phase and an evaluate phase. The precharge phase prepares the array for the next read or write operation by driving bitlines to a precharge value, such as high. The evaluate phase can be a read or a write operation. The evaluate phase reads or writes data values, such as "ones" or "zeroes," to storage cells in the array. The read and write operations also require a number of steps. A read operation drives the bitline to a precharge value, such as high, energizes a wordline so that the data value stored in the storage cell is readable on the bitline, and senses the stored data value on the bitline as a "zero" or a "one." A write operation drives the bitline to the data value to be stored, and then energizes the wordline to store the data in the storage cell.

The present approach presents a two-fold problem regarding energy use. First, one of the bitline is charged unnecessarily when the precharge value would be read as the stored data value. In a read operation, both the true and complement lines are precharged to high. Either the true line or complement line discharges to low when the wordline is energized so the stored data value can be sensed. This wastes energy in unnecessarily recharging the true line or complement line after it is discharged to low when the precharge value would be read as the stored data value.

Second, the wordline is charged unnecessarily when the precharge value would be read or written as the stored data value. In a read operation, the wordline is energized to discharge the true line or complement line to low. This wastes energy when the precharge value would be read as the stored data value. For example, if the precharge value would be read as a "one" and a "one" is stored in the storage cell to be read, there is no need to energize the wordline when reading the storage cell. In a write operation, the true and complement lines are set to the values appropriate for the data value to be stored (high-low or low-high), so energy is wasted by energizing the wordline when the stored data value is the same as the value to be stored.

This two-fold problem is particularly apparent for uniform data words, i.e., data words in which the bits forming the data word are all "ones" or all "zeroes." The power usage is often substantial because of the high capacitance of the bitlines and the number of bitlines. Wasting energy limits the operating time of portable devices powered by batteries. In addition, the high information density of new storage arrays causes problems in dissipating heat from the components, resulting in operational problems and reduced component reliability.

It would be desirable to have a system and method of selective row energization based on write data that would overcome the above disadvantages.

SUMMARY OF THE INVENTION

One aspect of the present invention provides a selective row energization system including a storage array having M rows and N columns; an N-bit data word register operably connected to the N columns; a uniform-detect circuit responsive to a data word in the N-bit data word register to generate a uniform word data bit for the data word, the uniform word data bit having a first value when the data word is uniform; an M-bit uniform-detect register having M uniform-detect latches, the M-bit uniform-detect register being operably connected to the M rows, each of the M uniform-detect latches being associated with one of the M rows and storing the uniform word data bit for the data word stored in the associated M row; and an M-bit row driver device operably connected to the M rows, the M-bit row driver device being responsive to the uniform word data bit for each of the M rows to inhibit energization of the M rows for which the uniform word data bit is the first value.

Another aspect of the present invention provides a method for selective row energization in an array including determining whether a data word is uniform; setting a uniform word data bit to a first value when the data word is uniform; storing the data word in the array; determining whether the uniform word data bit is the first value; and inhibiting energization of the stored data word when the uniform word data bit is the first value.

Another aspect of the present invention provides a selective row energization system for an array including means for determining whether a data word is uniform; means for setting a uniform word data bit to a first value when the data word is uniform; means for storing the data word in the array; means for determining whether the uniform word data bit is the first value; and means for inhibiting energization of the stored data word when the uniform word data bit is the first value.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DESCRIPTION OF THE PREFERRED EMBODIMENT

Figure 1:
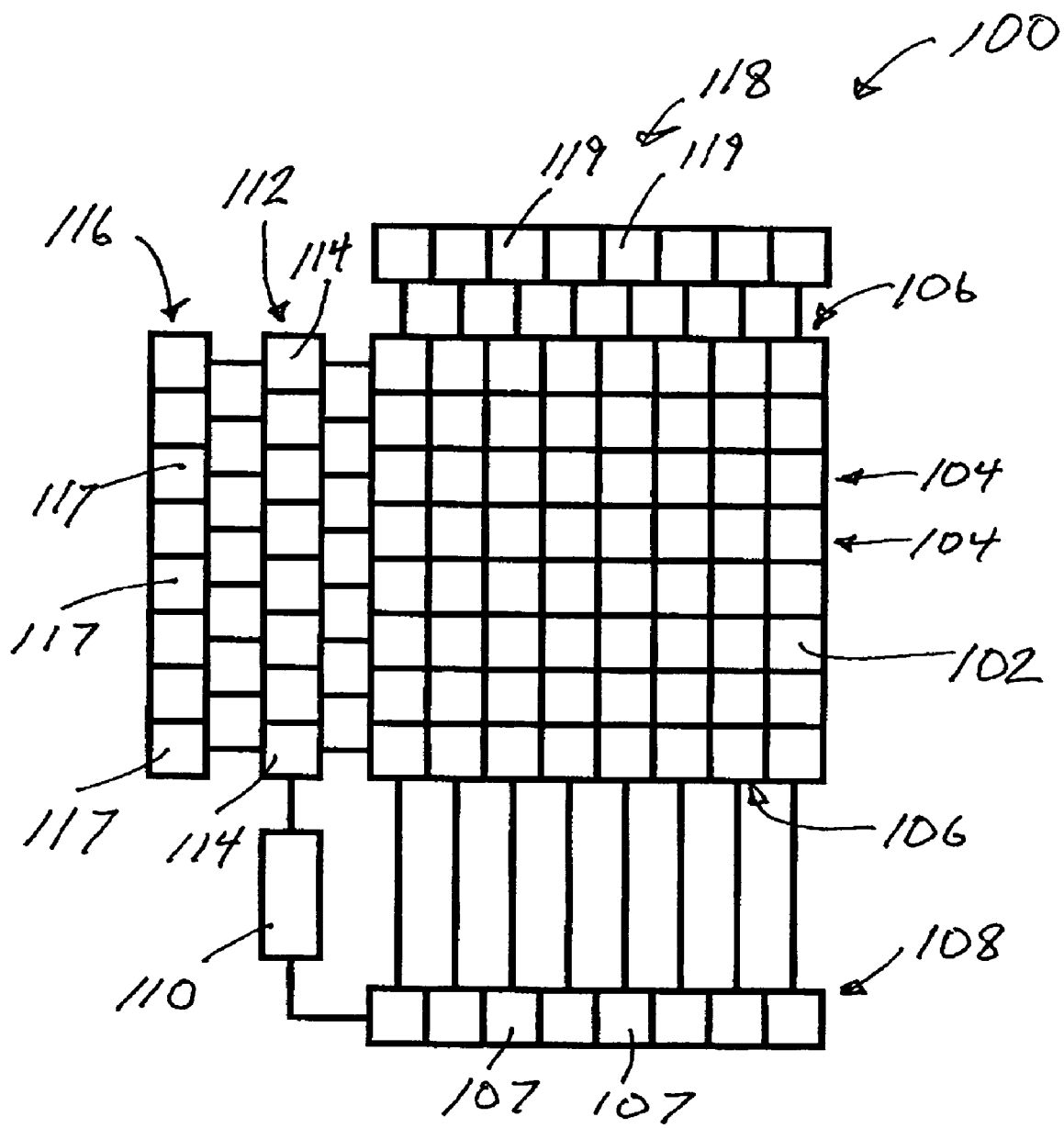
FIG. 1 is a block diagram of a selective row energization system made in accordance with the present invention.

FIG. 1 is a block diagram of a selective row energization system made in accordance with the present invention. The selective row energization system detects when a data word to be written to a row is uniform and stores a uniform word data bit to determine whether to inhibit energization of the row in a storage array storing the data word. As used herein, a data word is defined as "uniform" when the bits forming the data word are all "ones" or all "zeroes."

The selective row energization system 100 includes a storage array 102 having M rows 104 and N columns 106, an N-bit data word register 108 having N latches 107, a uniform-detect circuit 110, an M-bit uniform-detect register 112 having M uniform-detect latches 114, an M-bit row driver device 116 having M row drivers 117, and an N-bit column driver device 118 having N column drivers 119. The N-bit data word register 108 is operably connected to the N columns 106 of the storage array 102. The uniform-detect circuit 110 is responsive to a data word in the N-bit data word register 108 to generate a uniform word data bit for the data word. The uniform word data bit has a first value when the data word is uniform, such as all "ones" or all "zeroes," and a second value when the data word is not uniform, such as a mixture of "ones" and "zeroes." The M-bit uniform-detect register 112 is operably connected to the M rows 104 of the storage array 102. Each of the M uniform-detect latches 114 of the M-bit uniform-detect register 112 is associated with one of the M rows 104 of the storage array 102 and stores the uniform word data bit for the data word stored in the associated M row 104. The M row drivers 117 of the M-bit row driver device 116 are operably connected to the M rows 104 of the storage array 102 as wordlines. The M-bit row driver device 116 is responsive to the uniform word data bit stored in the M uniform-detect latch 114 for each of the M rows 104 to inhibit energization of the M rows 104 for which the uniform word data bit is the first value. The N column drivers 119 of the N-bit column driver device 118 are operably connected to the N columns 106 of the storage array 102 as bitlines. The storage array 102 can be any storage array for storing data words. Exemplary storage arrays include static random access memory (SRAM) arrays. Those skilled in the art will appreciate that the storage arrays are not limited to SRAM arrays and can be other types of arrays, such as dynamic random access memory (DRAM) arrays.

In operation, a data word N bits long is loaded into the N-bit data word register 108. The uniform-detect circuit 110 determines whether the data word is uniform, i.e., whether the data word is all "ones" or all "zeroes," as desired for a particular application. In one embodiment, the data word is considered uniform when the data word is all "ones." In another embodiment, the data word is considered uniform when the data word is all "zeroes." When the data word is uniform, the uniform-detect circuit 110 sets a uniform word data bit to a first value. When the data word is not uniform, the uniform-detect circuit 110 sets the uniform word data bit to a second value. The data word is loaded into one of the M rows 104 and the uniform word data bit associated with the data word is loaded into the M uniform-detect latch 114 associated with the M row 104 into which the data word is loaded. The data word is loaded into the storage array 102 by selectively enabling the M-bit row driver device 116 and enabling all of the N-bit column driver device 118.

The uniform word data bit can be used to determine whether to inhibit energization of the associated M row during the read cycle. When the data in one of the M rows is uniform and has a stored value such that the precharge value reads the same as the stored value, the M row does not need to be energized since the precharge value can be read as the stored value. In one example, the M rows 104 have a precharged value which will read as a "one." When the uniform word data bit indicates that the stored data in one of the M rows is uniform with all "one" bits, there is no need to energize that row since the precharge value will read as "ones." The situation is similar when the precharged value is the opposite state.

In yet another example, the uniform word data bit can be used when the data words and/or storage array is divided into different portions. The M rows 104 can be unused in certain applications having different data word lengths, such as applications switching between 64-bit and 32-bit data words, so that 32-bit arrays are unused during the 32-bit applications. When the uniform word data bit indicates that the data stored in one or more of the M rows is uniform with all "zero" or "one" bits, as desired for a particular application, there is no need to energize those rows since they are unused. In this embodiment, the data word is divided between two 32-bit rows, each with its own uniform word data bit which controls energization of the associated 32-bit row. The use of selective line gating with data words of variable length is discussed further in conjunction with FIG. 4.

The energy savings possible by inhibiting energization of the associated M row can be illustrated by examining the evaluate phase of an SRAM array in detail. The N column drivers 119 of the N-bit column driver device 118 are operably connected to the N columns 106 of the storage array 102 as bitlines. The M row drivers 117 of the M-bit row driver device 116 are operably connected to the M rows 104 of the storage array 102 as wordlines. The bitlines for an exemplary SRAM array typically include a true line and a complement line. In a read operation, both the true and complement lines are precharged to high. Without the selective row energization of the present invention, either the true line or complement line discharges to low when the wordline is energized, so that the stored data value can be sensed. This uses energy both in energizing the wordline and in recharging to high the true line or complement line that discharged to low. With the selective row energization of the present invention, the wordline energization is inhibited, so both the true line and the complement line remain high. This saves the energy of energizing the wordline and of recharging the true line or the complement line. In a write operation, the true and complement lines are set to the values appropriate for the data value to be stored (high-low or low-high), so energy is saved by not energizing the wordline.

Figure 2:
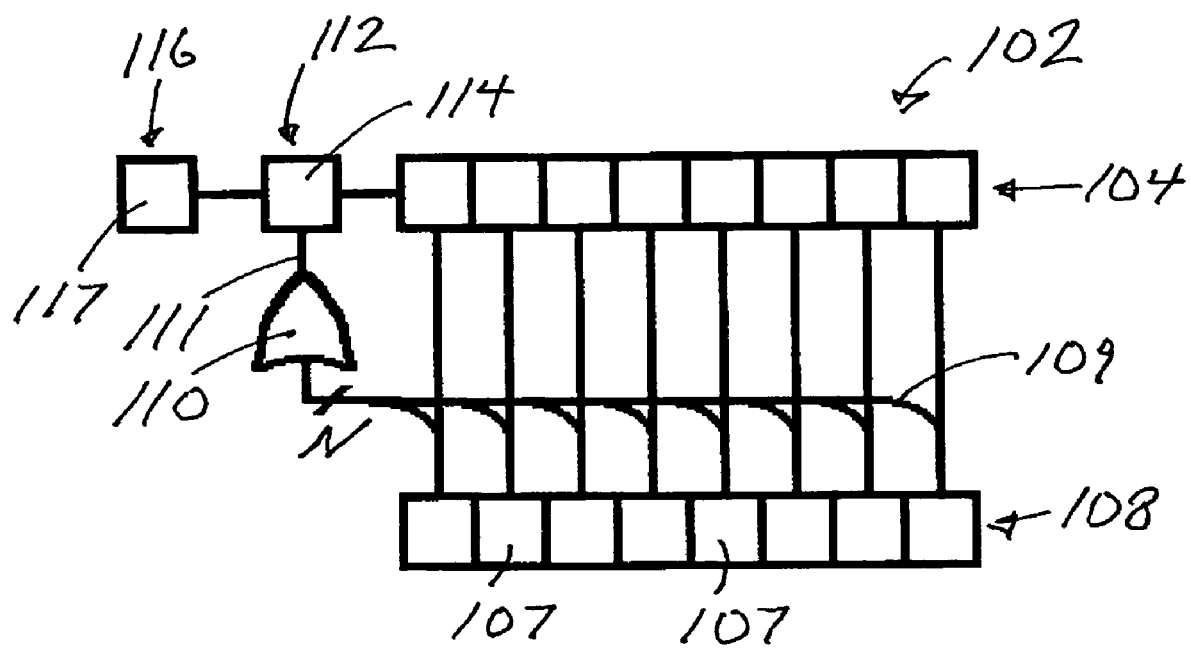
FIG. 2 is a block diagram of a uniform-detect circuit for a selective row energization system made in accordance with the present invention.

FIG. 2, in which like elements share like reference numbers with FIG. 1, is a block diagram of a uniform-detect circuit for a selective row energization system made in accordance with the present invention. In this example, the uniform-detect circuit is an N-wide OR gate.

The N-bit data word register 108 has N latches 107 for receiving data words to be stored in the storage array 102. Each of the N latches 107 is operably connected by line 109 to an input of the uniform-detect circuit 110, which in this example is an N-wide OR gate. The output of the uniform-detect circuit 110 is operably connected by line 111 to the M uniform-detect latch 114 of M-bit uniform-detect register 112. The output of the uniform-detect circuit 110 is a "one" when one or more of the inputs to the uniform-detect circuit 110 is a "one," i.e., when the data word in the N-bit data word register 108 includes a data bit that is a "one." When all the inputs to the uniform-detect circuit 110 are "zeroes," the output of the uniform-detect circuit 110 is a "zero."

In operation, a data word is loaded into the N-bit data word register 108. When the data word is not uniformly "zero," i.e., when any one of the N latches 107 is a "one," the output of the uniform-detect circuit 110 provided to the M uniform-detect latch 114 of M-bit uniform-detect register 112 is a "one." When the data word is uniformly "zero," i.e., when all of the N latches 107 are "zeroes," the output of the uniform-detect circuit 110 provided to the M uniform-detect latch 114 of M-bit uniform-detect register 112 is a "zero." The output of the uniform-detect circuit 110, which is the uniform word data bit, is loaded into the M uniform-detect latch 114 of the M-bit uniform-detect register 112 associated with the M row 104 of the storage array 102 when the data word is loaded into the storage array 102. The uniform word data bit stored in the M uniform-detect latch 114 is now available for controlling whether the energization of the associated M row 104 of the storage array 102 should be inhibited or allowed. Those skilled in the art will appreciate that the uniform-detect circuit 110 can be any logic gate or combination of logic gates selected for a particular application and selected to provide the desired value of the uniform word data bit for uniform and non-uniform data words stored in the associated M row 104 of the storage array 102. For example, the output of the uniform-detect circuit 110 can be inverted so that the M uniform-detect latch 114 of the M-bit uniform-detect register 112 is a "one" when all of the N latches 107 are "zeroes."

Figure 3:
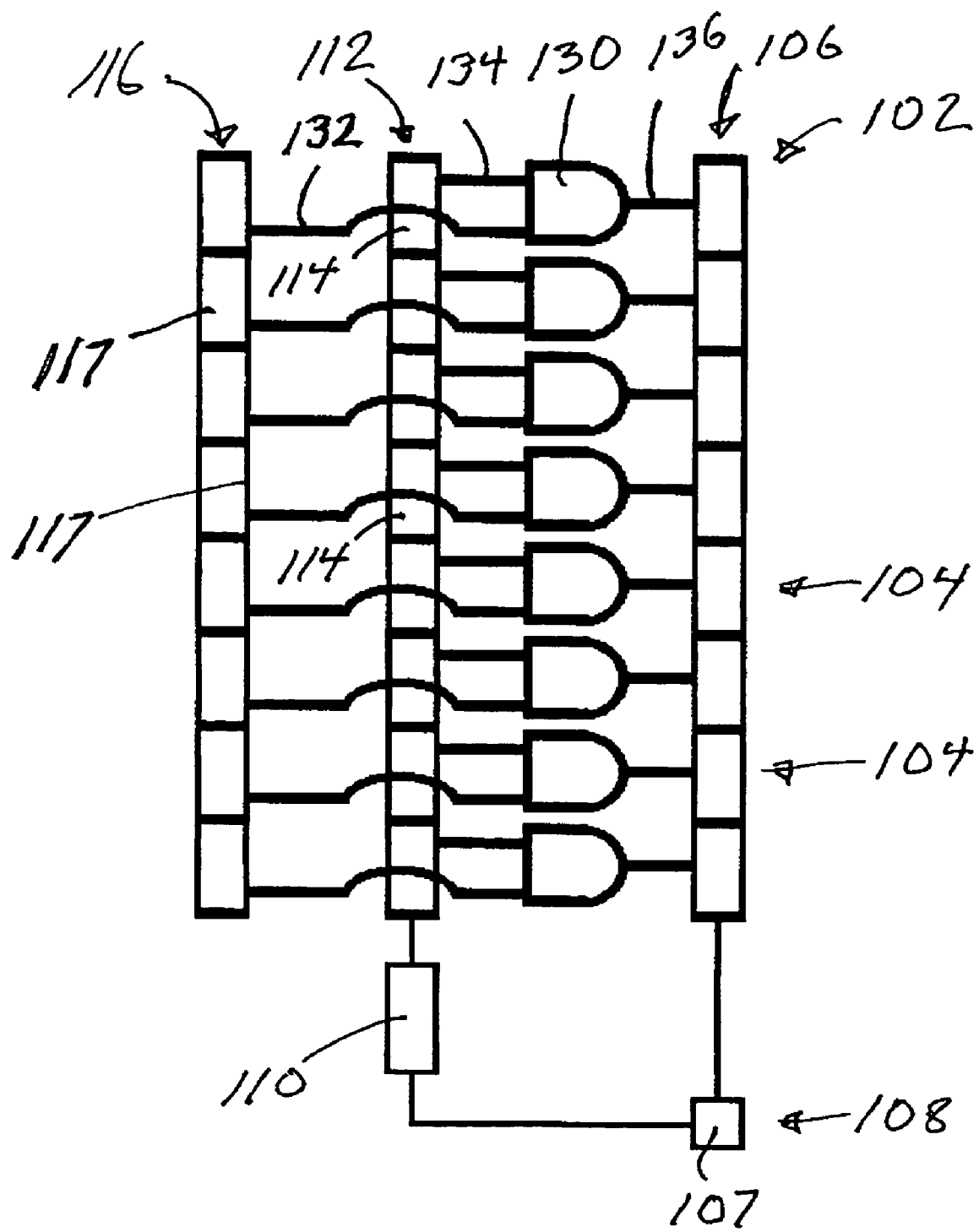
FIG. 3 is a block diagram of an M-bit long row driver device and zero-detect register for a selective row energization system made in accordance with the present invention.

FIG. 3, in which like elements share like reference numbers with FIG. 1, is a block diagram of an M-bit row driver device and uniform-detect register for a selective row energization system made in accordance with the present invention. In this example, the M-bit row driver device and zero-detect register are gated together to control energization of the M rows of the storage array.

The M-bit uniform-detect register 112 has M uniform-detect latches 114 for storing uniform word data bits associated with the M rows 104 of the storage array 102. The M-bit row driver device 116 controls energization of the M rows 104 by the output of the M row drivers 117. The uniform word data bits in the M uniform-detect latches 114 and the output of the M row drivers 117 are provided to the M row control logic 130 by uniform input 134 and driver input 132, respectively. The M row control logic 130, which in this case is an AND gate, determines whether energization of the associated M row 104 is inhibited or allowed. In this example, control output 136 is only a "one" when both the uniform input 134 and the driver input 132 are "ones." Therefore, the control output 136 is set to "zero" and the associated M row 104 is not energized unless the uniform input 134 is a "one."

Those skilled in the art will appreciate that the M row control logic 130 can be any logic gate or combination of logic gates selected for a particular application. The M row control logic 130 can be selected to provide the desired value of the control output 136 to the M row 104 for the output of the associated M row driver 117 of the M-bit row driver device 116 in combination with the uniform word data bit for uniform and non-uniform data words stored in the associated M row 104 of the storage array 102.

Figure 4:
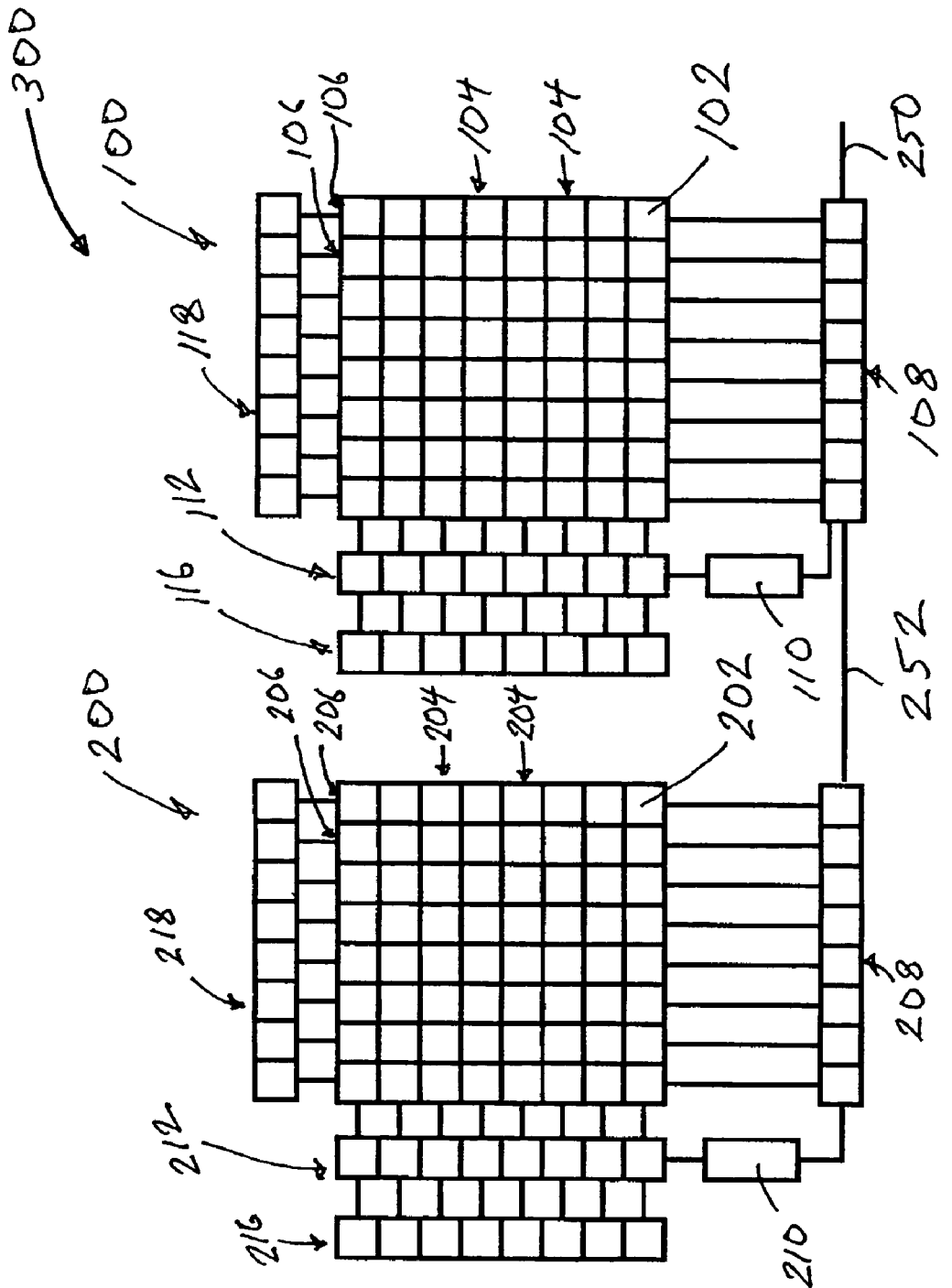
FIG. 4 is a block diagram of an array structure divided into portions employing a selective row energization system made in accordance with the present invention.

FIG. 4, in which like elements share like reference numbers with FIG. 1, is a block diagram of an array structure divided into portions employing a selective row energization system made in accordance with the present invention. In this example, the selective line gating allows use of data words of variable length without unnecessary energization of unused storage arrays.

The multiple array selective row energization system 300 includes a first selective row energization system 100 and a second selective row energization system 200. The first selective row energization system 100 includes a storage array 102 having M rows 104 and N columns 106, an N-bit data word register 108, a uniform-detect circuit 110, an M-bit uniform-detect register 112, an M-bit row driver device 116, and an N-bit column driver device 118. The second selective row energization system 200 includes a storage array 202 having I rows 204 and J columns 206, a J-bit data word register 208, a uniform-detect circuit 210, an I-bit uniform-detect register 212, an I-bit row driver device 216, and a J-bit column driver device 218. In this example, data words are input serially on data input 250, advancing through the N-bit data word register 108 and data connection 252 to reside in the N-bit data word register 108 and the J-bit data word register 208. When the data word is J+N bits wide, non-uniform data is present in both the N-bit data word register 108 and the J-bit data word register 208. In one example, when the data word is N bits wide, non-uniform data is present in the N-bit data word register 108 and the J-bit data word register 208 includes uniform data, such as all "zeroes" or all "ones."

One example showing the usefulness of the multiple array selective row energization system 300 is a 32-bit application running on a 64-bit computer. In operation, the 32-bit data word is loaded into the N-bit data word register 108 through the data input 250. The data word in the N-bit data word register 108 is used and non-uniform, so the word data bits are a mixture of "ones" or "zeroes." The data word in the J-bit data word register 208 is unused and uniform, so each word data bit has an exemplary value of "zero." The uniform-detect circuit 210 can be a J-wide OR gate as discussed for FIG. 2. Referring to FIG. 4, the uniform-detect circuit 210 generates a "zero" as the uniform word data bit for the uniform data word in the J-bit data word register 208. The uniform word data bit is stored in the I-bit uniform-detect register 212 in association with storing the uniform data word in the storage array 202. The "zero" in the I-bit uniform-detect register 212 inhibits energizing the associated M row 204. Because the storage array 202 is unneeded for the 32-bit application, each of the uniform word data bits in the I-bit uniform-detect register 212 will be "zero" and energization of the storage array 202 will be inhibited. The uniform word data bits in the M-bit uniform-detect register 112 will be generally "one," so energization of the storage array 102 will be allowed.

When the application is a 64-bit application, both the N-bit data word register 108 and the J-bit data word register 208 receive non-uniform data words, i.e., the two 32-bit portions of the 64-bit data word. The uniform-detect circuit 110 and uniform-detect circuit 210 load "ones" as the uniform word data bits into the M-bit uniform-detect register 112 and I-bit uniform-detect register 212, so that energization of both the storage array 102 and the storage array 202 is allowed, since they both contain non-uniform data. A similar approach can be used with a 32-bit or 64-bit application running on a 128-bit computer.

Those skilled in the art will appreciate that the multiple array storage with selective line gating can be designed for a particular application as desired. In one embodiment, a number of selective row energization systems can be operably connected to accommodate any length data string, of which a portion of the data may not be used in all applications, such as the 32-bit application on a 64-bit or 128-bit computer as discussed above. Likewise, the multiple array storage with selective line gating can be used where software uses 64-bit words, but storage or busses use longer words, such as a 256-bit quad word configuration or a 512-bit word. In another embodiment, the storage array 102 and the storage array 202 can be portions of a single storage array. In yet another embodiment, the N-bit data word register 108 and the J-bit data word register 208 can be portions of a single word register. In yet another embodiment, the storage array 102 and the storage array 202 can be of different sizes and/or shapes, having different numbers of rows and/or columns. Those skilled in the art will appreciate that it is not unusual to divide an array uniformly to save energy. The array can also be divided non-uniformly as desired for a particular application.

Figure 5A:
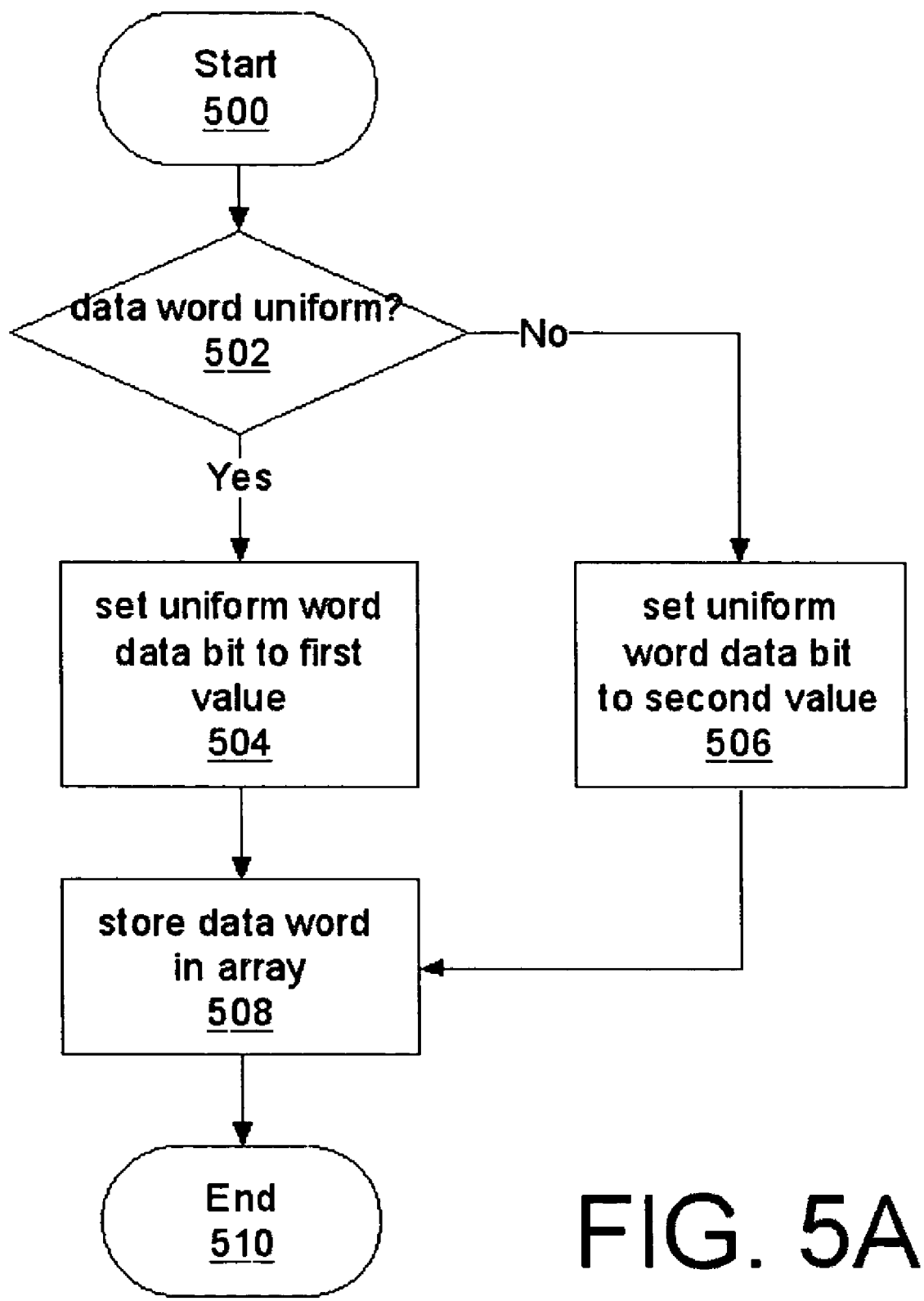
FIGS. 5A and 5B are a flow chart for a uniform word data bit setting and read, respectively, for a selective row energization method in accordance with the present invention.
Figure 5B:
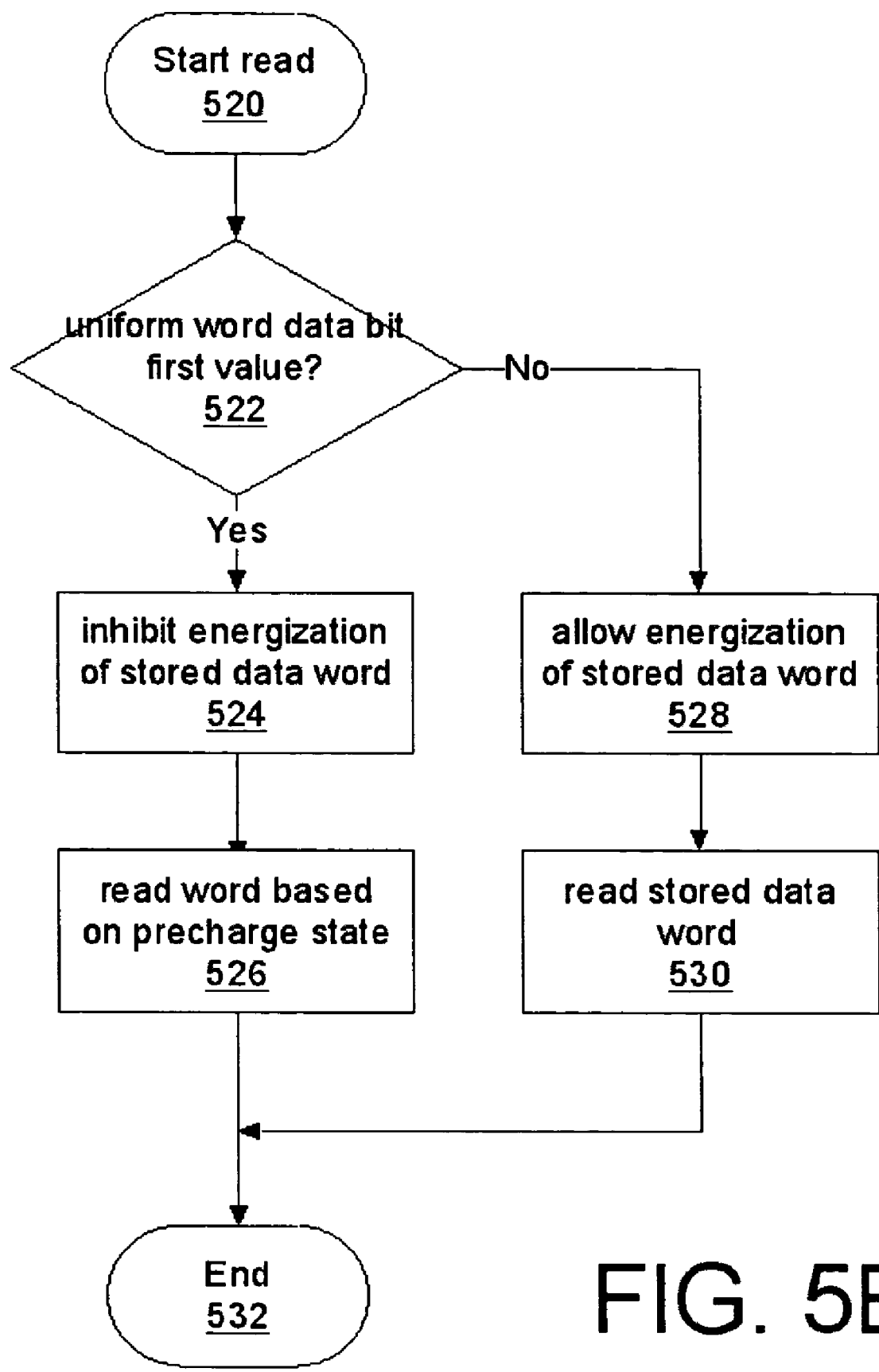

FIGS. 5A and 5B are a flow chart for a uniform word data bit setting and read, respectively, for a selective row energization method in accordance with the present invention. The uniform word data bit setting method starts at 500. At 502, it is determined whether a data word is uniform. In one embodiment, the data word includes word bits and the determining whether a data word is uniform 502 includes ORing the word bits. A uniform word data bit is set to a first value when the data word is uniform at 504. In one embodiment, the uniform word data bit is set to a second value when the data word is uniform at 506. The data word is stored in an array at 508 and the uniform word data bit setting method ends at 510.

The read method starts at 520. At 522, it is determined whether the uniform word data bit is the first value. When the uniform word data bit is the first value, energization of the stored data word is inhibited at 524 and a word is read based on a precharge state at 526. In one embodiment, the energization of the stored data word is allowed at 528 when the uniform word data bit is not the first value, i.e., when the uniform word data bit is the second value, and the stored data word is read at 530. The read method ends at 532.

It is important to note that the figures and description illustrate specific applications and embodiments of the present invention, and is not intended to limit the scope of the present disclosure or claims to that which is presented therein. In one example, the various operations can use different logic combinations and different logic states that those described above. In another example, the operations can be performed column-wise rather than row-wise, by operably connecting the uniform-detect register to the column driver device rather than the row driver device. Upon reading the specification and reviewing the drawings hereof, it will become immediately obvious to those skilled in the art that myriad other embodiments of the present invention are possible, and that such embodiments are contemplated and fall within the scope of the presently claimed invention.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

The invention claimed is:

1. A selective row energization system comprising:
   a storage array having M rows and N columns;
   an N-bit data word register operably connected to the N columns;
   a uniform-detect circuit responsive to a data word in the N-bit data word register to generate a uniform word data bit for the data word, the uniform word data bit having a first value when the data word is uniform and having a second value when the data word is not uniform;
   an M-bit uniform-detect register having M uniform-detect latches, the M-bit uniform detect register being operably connected to the M rows, each of the M uniform-detect latches being associated with one of the M rows and storing the uniform word data bit for the data word stored in the associated M row; and
   an M-bit row driver device operably connected to the M rows, the M-bit row driver device being responsive to the uniform word data bit for each of the M rows to inhibit energization of the M rows for which the uniform word data bit is the first value and being responsive to the uniform word data bit for each of the M rows to allow energization of the M rows for which the uniform word data bit is the second value.

2. The system of claim 1 wherein the N-bit data word register has N latches, and the uniform-detect circuit is an N-wide OR gate having N inputs operably connected to each of the N latches and having an output operably connected to the M-bit uniform-detect register.

3. The system of claim 1 wherein the M-bit row driver device has M row drivers; and further comprising M row control logic having a driver input, a uniform input, and a control output, the driver input being operably connected to one of the M row drivers associated with one of the M rows, the uniform input being operably connected to one of the M uniform-detect latches associated with the one of the M rows, and the control output being operably connected to the one of the M rows.

4. The system of claim 3 wherein the M row control logic is an AND gate.

5. The system of claim 1 further comprising:
   a second storage array having I rows and J columns; a J-bit data word register operably connected to the J columns;
   a second uniform-detect circuit responsive to a second data word in the J-bit data word register to generate a second uniform word data bit for the second data word, the second uniform word data bit having a second array first value when the second data word is uniform;
   an I-bit uniform-detect register having I uniform-detect latches, the I-bit uniform-detect register being operably connected to the I rows, each of the I uniform-detect latches being associated with one of the I rows and storing the second uniform word data bit for the second data word stored in the associated I rows; and
   an 1-bit row driver device operably connected to the I rows, the 1-bit row driver device being responsive to the second uniform word data bit for each of the I rows to inhibit energization of the I rows for which the second uniform word data bit is the second array first value;
   wherein the N-bit data word register and the J-bit data word register are operably connected to receive a variable length data word comprising the data word and the second data word.

6. The system of claim 5 wherein the second uniform word data bit has a second array second value when the second data word is not uniform and the I-bit row driver device is responsive to the second uniform word data bit for each of the I rows to allow energization of the I rows for which the second uniform word data bit is the second array second value.

7. The system of claim 5 wherein the J-bit data word register has J latches, and the second uniform-detect circuit is a J-wide OR gate having J inputs operably connected to each of the J latches and an output operably connected to the I-bit uniform-detect register.

8. The system of claim 5 wherein the storage array and the second storage array are portions of a single storage array.

9. The system of claim 5 wherein the N-bit data word register and the J-bit data word register are portions of a single word register.

10. The system of claim 5 wherein N is 32 and J is 32.

11. The system of claim 1 further comprising an N-bit column driver device operably connected to the N rows.

12. The system of claim 1 wherein the storage array is selected from the group consisting of static random access memory (SRAM) arrays and dynamic random access memory (DRAM) arrays.

13. A selective row energization system for an array comprising:
- means for determining whether a data word is uniform;
- means for setting a uniform word data bit to a first value when the data word is uniform;
- means for setting the uniform word data bit to a second value when the data word is not uniform;
- means for storing the data word in the array;
- means for determining whether the uniform word data bit is the first value;
- means for inhibiting energization of the stored data word when the uniform word data bit is the first value; and
- means for allowing energization of the stored data word when the uniform word data bit is the second value.

14. The system of claim 13 further wherein the data word comprises word bits and the means for determining whether a data word is uniform comprises means for ORing the word bits.

15. The system of claim 13 wherein the array is selected from the group consisting of static random access memory (SRAM) arrays and dynamic random access memory (DRAM) arrays.

* * * * *